United States Patent [19]
Johnson et al.

[11] Patent Number: 4,460,434
[45] Date of Patent: Jul. 17, 1984

[54] METHOD FOR PLANARIZING PATTERNED SURFACES

[75] Inventors: Leo F. Johnson, Bedminster; Dawon Kahng, Bridgewater Township, Somerset County, both of N.J.

[73] Assignee: AT&T Bell Laboratories, Murray Hill, N.J.

[21] Appl. No.: 487,113

[22] Filed: Apr. 26, 1983

Related U.S. Application Data

[63] Continuation of Ser. No. 368,567, Apr. 15, 1982, abandoned.

[51] Int. Cl.³ .................. H01L 21/306; B44C 1/22; C03C 15/00; C03C 25/06
[52] U.S. Cl. .................... 156/643; 156/657; 204/192 E
[58] Field of Search ........ 156/643, 648, 649, 650-653, 156/655, 657, 659.1, 662; 204/192 EC, 192 E

[56] References Cited

U.S. PATENT DOCUMENTS

| | | | |
|---|---|---|---|
| 3,860,783 | 1/1975 | Schmidt et al. | 204/192 E X |
| 3,990,927 | 11/1976 | Montier | 156/657 |
| 4,214,966 | 7/1980 | Mahoney | 156/643 X |
| 4,292,156 | 9/1981 | Matsumoto et al. | 156/649 X |
| 4,377,438 | 3/1983 | Moriya et al. | 156/643 |
| 4,385,975 | 5/1983 | Chu et al. | 156/657 X |

OTHER PUBLICATIONS

Appl. Phys. Lett. 40(7), Apr. 1, 1982, Planarization of Patterned Surfaces by Ion Beam Erosion, L. F. Johnson et al., pp. 636-638.
IBM Technical Disclosure Bulletin, vol. 21, No. 5, Oct. 1978, Dielectric Isolation Planarization by T. A. Bartush et al., pp. 1868-1869.
IBM Technical Disclosure Bulletin, vol. 21, No. 5, Oct. 1978, Reestablishing Parallelism after Rie Etching by H. B. Pogge, pp. 1849-1850.

Primary Examiner—William A. Powell
Attorney, Agent, or Firm—Richard D. Laumann

[57] ABSTRACT

A method of planarizing a surface using ion beam milling at a non-normal angle of incidence that is useful in semiconductor device manufacture is described.

12 Claims, 7 Drawing Figures

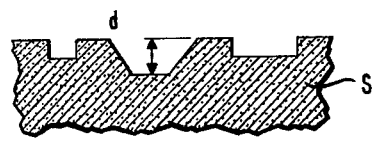
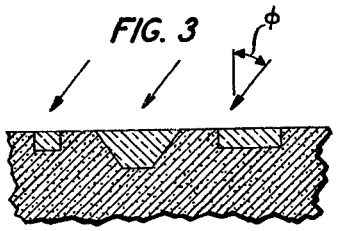
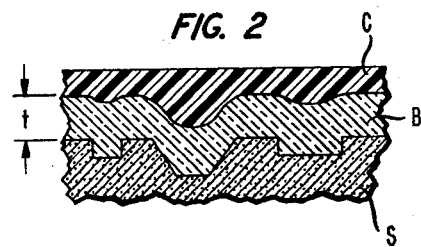
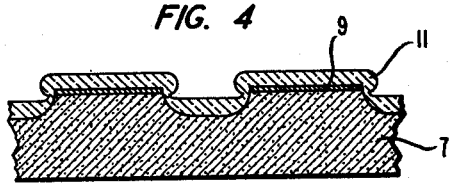
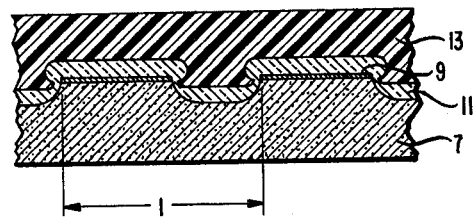
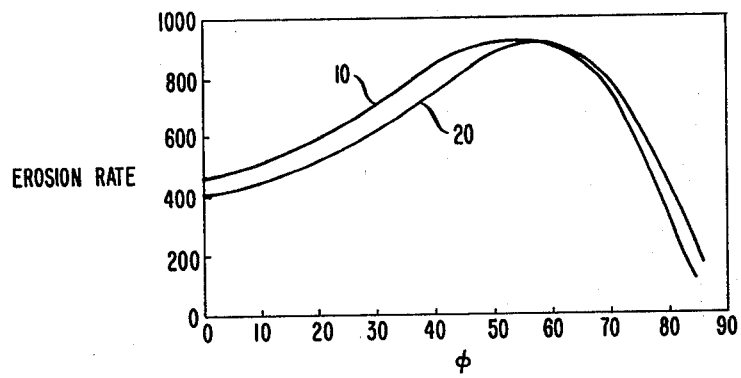

METHOD FOR PLANARIZING PATTERNED SURFACES

This application is a continuation of application Ser. No. 368,567, filed Apr. 15, 1982, abandoned.

TECHNICAL FIELD

This invention relates generally to a method of pattern delineation of surfaces and particularly both to a method of planarizing such pattern delineated surfaces and to semiconductor device fabrication using this planarizing method.

BACKGROUND OF THE INVENTION

The fabrication of integrated circuits is a complicated multistep process which typically involves at least one step in which a layer of material is deposited on a substrate and selected portions of the layer are removed to expose the underlying substrate material. The underlying material so exposed is then modified by, for example, diffusion or ion implantation of selected materials.

Many semiconductor materials are known and potentially useful in integrated circuits, but the overwhelming majority of present-day integrated circuits is fabricated from silicon.. When integrated circuits are fabricated with silicon, a layer of silicon dioxide is generally thermally grown on a silicon wafer and then a layer of resist material is deposited on the silicon dioxide. Selected portions of the resist are exposed to radiation, e.g., electromagnetic radiation or electron beams, which renders the exposed portions of the resist either more or less soluble than the unexposed portion of the resist when the resist is subjected to a suitable developer. After removal of the more soluble resist portions and the underlying oxide layer, the exposed semiconductor material may be modified. In typical semiconductor processing sequences, the above-described process is repeated at least several times, and the last device fabrication step is typically deposition of metallic ohmic contacts. The described or similar processing sequences may also be used to fabricate devices other than integrated circuits, e.g., magnetic bubble memory devices and charge coupled devices, and to fabricate devices with other semiconductor materials.

If the surface which the resist is supposed to cover is rough, i.e., has steps produced by the previous processing steps, the resist surface may not be flat for reasonable resist thicknesses. Repetition of the processing steps generally will lead to the existence of steps on the patterned surfaces and the steps will present problems to the achievement of both higher speed and higher packing density of integrated circuit devices. The problems are present because the minimum feature size attainable with the lithographic techniques is limited by the resolution and linewidth control limitations associated with the presence of steps. Poor coverage of stepped surfaces will also lead to unreliable metallization interconnections and resulting device imperfections. It will also almost certainly preclude the vertical stacking of integrated circuits. These problems, of course, become still more severe as devices are fabricated with finer features. These problems may be removed or their deleterious side effects reduced if the recesses on the patterned surface are filled with an inert material and the surface planarized prior to subsequent patterning operations, i.e., if the surface is prepared so that each processing level begins with a planar rather than a stepped or structured surface.

Such planarization may be accomplished, at least in theory, by covering the patterned surface of a semiconductor material, S, with a film of an inert material, B, followed by a film of a liquid-like material C. Material B is desirably inert to prevent any undesired reaction with the patterned surface. The liquid-like nature of material C insures that the top surface of C is planar. If all of the material C and the excess of material B, that is, material B that is above the surface of S, are now removed by a suitable technique, a planar surface will be obtained. Removal techniques, such as plasma etching and sputter etching, have been tried in attempts to produce planar surfaces. However, a planar surface is preserved with these techniques throughout the etching process only if the etch rates of materials B and C at the normal angle of incidence used by these techniques are identical. Unfortunately, the normal angle of incidence etch rates of materials B and C are, in general, different and the applicability of these etching techniques to planarizing processes is accordingly severely limited.

SUMMARY OF THE INVENTION

We have found that in a method of (semiconductor) device manufacturing, a patterned non-planar surface material may be planarized by depositing a first layer having a planar surface of a first material on the surface of the material and milling the surface with a particle beam at a non-normal angle of incidence and a momentum chosen so that the ion beam erosion rates for the two materials are substantially equal, i.e., the two materials are eroded at substantially equal rates. In a preferred embodiment, the first material has a liquid-like nature that insures a planar surface regardless of the topography of the underlying material. When the angle and momentum that produce substantially equal erosion rates are used, a planar surface is preserved throughout the material removal process. In another preferred embodiment, a second layer of a second material is deposited on a patterned semiconductor surface and the first layer of the liquid-like first material is deposited on the second layer. The angle of incidence and momentum of the particle beam are selected so that the removal rates of the first and second materials forming the first and second layers are substantially equal. In a further preferred embodiment, the planarizing of a patterned silicon wafer coated with a silicon dioxide layer which, in turn, is covered with a layer of resist such as AZ-1350J is accomplished with a 2 kV argon ion beam incident at an angle of approximately 59°. In yet another preferred embodiment, a patterned silicon wafer coated with a phosphosilicate glass layer and a resist layer is planarized with a 2 kV argon ion beam incident at an angle between 50° and 60°.

BRIEF DESCRIPTION OF THE DRAWING

FIGS. 1–3 schematically represent the planarizing method of this invention;

FIGS. 4–6 schematically represent the planarizing method of this invention as used with silicon and silicon dioxide; and FIG. 7 plots the angular dependence of the erosion rates for silicon dioxide and AZ-1350J photoresist for argon ion beam milling.

DETAILED DESCRIPTION

A patterned surface useful with the method of this invention is shown in cross section in FIG. 1. For reasons of clarity, the elements in this and the other FIGURES are not drawn to scale. In a preferred embodiment, the surface comprises a semiconductor material which is indicated as S and has a plurality of recesses, as a result of patterning. One recess is indicated as having a depth, d. The recesses may be through of as separating lines that are perpendicular to the plane of FIG. 1. The semiconductor material comprises, for example, silicon, etc. In FIG. 2, the patterned semiconductor surface has been covered with a layer of material indicated as B which, in turn, has been covered with a layer of material indicated as C. In several embodiments layer C comprises a resist, i.e., material which is sensitive to radiation such as electromagnetic radiation or electron beams. Layer B comprises a material that is desirably inert with respect to the covered material, that is, the semiconductor, and layer C desirably comprises a material having flow properties such that its upper surface is substantially planar, that is, it should be liquid-like. Layer B is a second layer comprising a second material and layer C is a first layer comprising a first material. The layer of material B has a thickness, t, which desirably should be equal to or in excess of the depth, d, of the recess. Lesser thicknesses may be used but a completely planar surface will not be produced. If the thickness of the layer of material B does not satisfy this requirement, the recess will not be completely filled with material B and a completely planarized surface may not be obtained when all of material C is removed. FIG. 3 shows the surface in cross section after it has been planarized by erosion caused by a particle beam incident at an angle of incidence, $\phi$, and with a momentum selected so that the erosion rates of materials B and C are essentially identical. The angle of incidence, $\phi$, is the angle between the ion beam direction and a line that is perpendicular to the semiconductor surface. If it is desired to remove semiconductor material and to obtain a planar surface, material B may be omitted. In this embodiment, the particle beam is incident at an angle and with a momentum selected so that the removal rates of first material and the semiconductor material are substantially equal. The particle beam may comprise neutral particles, such as molecules, or charged particles, such as ions.

After planarization has been completed, other device manufacturing steps, such as another pattern delineation step followed by substrate modification, may be practiced.

Our invention will be further described by specific reference to a first particular embodiment. After this embodiment has been discussed, a second particular embodiment together with variations and applications to other materials will be discussed and still other variations and applications will be readily apparent to those skilled in the art. In the first particular embodiment, silicon wafers were patterned with $Si_3N_4$ protected lines which were 3.3 $\mu$m wide and separated from each other by 5.5 $\mu$m. The surface was further covered by an $SiO_2$ film which was grown by low pressure chemical vapor deposition (LPCVD). Other methods may be used to form the $SiO_2$ film. This structure is shown in cross section in FIG. 4. The structure comprises silicon wafer 7, $Si_3N_4$ layer 9, and $SiO_2$ film 11. The silicon wafer has a patterned non-planar surface. The $Si_3N_4$ layers protect lines which are separated by recesses. The $SiO_2$ covering consisted, as shown, of a rounded cap approximately 1.5 $\mu$m thick over the line with re-entrant cavities just below the top of the feature. Although this thickness does not satisfy the condition $t > d$, it does show the versatility of the inventive method as an almost planar surface was obtained after ion beam milling. A liquid-like material, AZ-1350J photoresist, was spun on at 3000 rpm and baked at 150° C. to provide a planar film 1.5 $\mu$m thick over the $SiO_2$ covered features and 3 $\mu$m thick in the recesses between the features. This structure is shown in cross section in FIG. 5. The first material comprises the photoresist and the second material comprises $SiO_2$. The structure is identical to that depicted in FIG. 4 except that it shows resist layer 13 and the spatial distance between lines is indicated as l. A small ripple (not shown) was present on the surface of the resist and was believed to be due to the underlying structure with a peak-to-peak amplitude of approximately 0.15 $\mu$m. The surface was etched down to the tops of the features in the semiconductor surface, as shown in cross section in FIG. 6, with a neutralized 2 kV argon ion beam incident at an angle of approximately 60° in a Commonwealth Scientific IM-MI-2 ion miller. The resulting surface is essentially planar.

To ascertain the optimum angle of incidence, the 2 kV ion beam was incident on structures, such as that described with respect to FIG. 5, at various angles of incidence including 0°, 40°, 60°, and 70°. Edge profile scanning electron microscope photographs were taken of the surfaces after the ion beam milling was completed. At normal incidence, the resist was completely removed from the recess between the features while the $SiO_2$ still remained on top of the features. Thus, at normal incidence, the erosion rate of the resist is too fast for planarization of $SiO_2$ coated with AZ-1350J photoresist. At an angle of incidence of 40°, the $SiO_2$ was removed from the top of the feature and left in the $SiO_2$ border adjacent the feature walls. The level of the resist surface in the recess was 0.25 $\mu$m below the top of the feature. This small depression indicates that the erosion rate of the resist was only slightly higher than the erosion rate of $SiO_2$. Trenches present at the interface between the $SiO_2$ and resist were a consequence of the difference in erosion rates. At an ion beam angle of incidence of approximately 60°, the erosion rates of the resist and $SiO_2$ were essentially identical and an almost perfectly flat surface extending across the $Si_3N_4$, $SiO_2$ and photoresist was obtained.

The original surface was thus transformed from the stepped topography with recesses approximately 1.5 $\mu$m deep to a planar topography having maximum deviations from flatness that were less than 0.1 $\mu$m. The maximum deviation from flatness occurred at the narrow interface region between the $SiO_2$ and resist. Since no deviation from flatness was seen across the $Si_3N_4$—$SiO_2$ interface, it was believed that the deviation seen at the $SiO_2$—photoresist interface was due to a slightly different erosion rate for the resist at the interface as compared to its bulk value. Erosion at an ion beam incident angle of approximately 70°, revealed that the erosion rate of the resist was slightly lower than that of $SiO_2$ and that the level of the resist remaining in the recess was 0.25 $\mu$m higher than the exposed top of the feature. Shallow trenching at the $SiO_2$—resist interface was again the result of slightly different erosion rates.

The planarity of the surface produced by erosion at 60° was marred only by trenches approximately 800 Angstroms deep in the interface region between the SiO$_2$ and the photoresist. This interface existed only because the condition that the recesses be filled with SiO$_2$ was not completely satisfied. If this condition had been fulfilled, the trenches would not have existed or would have been greatly reduced in amplitude by erosion and an overall flatness to better than 500 Angstroms would be expected. It was also found that the planarity of the surface was not significantly altered by approximately 10 percent over-erosion, that is, erosion for a time approximately 10 percent longer than the time required to expose the Si$_3$N$_4$. However, over-erosion by approximately 25 percent produced deivations from planarity of <0.2 μm. Hence, erosion duration is not critical and end-point detection is not essential.

FIG. 7 plots the erosion rate vertically in Angstroms per minute versus the angle of incidence horizontally in degrees for SiO$_2$, indicated as curve 10, and AZ-1350J photoresist, indicated as curve 20. These curves were complied from literature data. As can be seen, erosion rates are approximately equal at an angle of incidence of approximately 60°. Our data showed that the erosion rate of the resist was faster than that of SiO$_2$ for an angle of incidence less than 60° and slower than that of SiO$_2$ for an angle of incidence greater than 60°. This is the reverse of the data shown in FIG. 7. This may be due to our use of higher energy (2 kV) ions, or to a variation in resist erosion rate with bake temperature. Our bake temperature of 150° C. was considerably higher than the 80° to 90° C. normally used for photolithography. This information signifies variables that are useful for adapting AZ-1350J photoresist to the planarizing of materials other than SiO$_2$.

A second particular embodiment planarizes a pattern delineated material having a layer of phosphosilicate glass on a semiconductor such as silicon. This glass, which is a phosphorus-containing modification of silicon dioxide, is used for dielectric isolation in integrated circuit devices. While this glass flows at approximately 1000° C. and may be planarized or altered to a more gently sloped topography by heating, many devices, such as shallow diffused junctions, will not tolerate heat treatment at this temperature. Planarization of flowed or unflowed phosphosilicate glass without heating would thus be desirable.

Silicon wafers were patterned with rectangular lines 4 μm wide and 0.8 μm high which were then covered with phosphosilicate glass which comprised approximately 6.5 weight percent phosphorus in SiO$_2$. The glass surface consisted of stepped stripes approximately 1 μm high over the polysilicon features with trenches at the base of each stripe. The possibility of discontinuous coverage may be reduced at this point by heat treating the coated wafer in an inert atmosphere to flow the glass. AZ-1350J photoresist was spun onto the wafer and hardened at 80° C. to provide a planarizing film approximately 1.8 μm thick over the glass features. Erosion with a 2 kV argon ion beam incident at angles between 50° and 60° produced an essentially planar surface while lesser and greater angles did not yield such a surface.

Modifications of the two embodiments described are readily thought of. The curves in FIG. 7 depend not only on the characteristics of the materials being ion beam milled but also on the energy of the ion beam. This is understood when it is considered that ion beam milling is essentially a momentum transfer process, i.e., the particles in the ion beam transfer sufficient energy to the particles in the material being milled to enable them to escape from the surface. Consequently, the beam characteristics, i.e., energy and angle of incidence, must be selected so that the probability of removing particles by ion beam milling is substantially equal for the different materials being milled. The probability will also depend upon the masses of the particles being removed, i.e., sufficient momentum must be transferred from the beam particles to the particles in the materials being milled to erode the latter particles. The optimum angle is easily determined as it was for the two particular embodiments.

Although our invention has been described specifically with respect to silicon, a layer of a glass material such as silicon dioxide or phosphosilicate glass and a layer of resist, it will be readily apparent that other materials may be used and that particle beams other than argon ion beams may be used. For example, semiconductor materials, such as GaAs or InP may be used rather than silicon. Further, glasses other than silicon dioxides or phosphosilicate glass may be used. Additionally, only the liquid-like layer may be present if it is desired to modify the underlying patterned material by removing a portion of this material. Also, the first material which comprises the first layer need not be liquid-like if a planar surface can be obtained by other methods. Furthermore, out invention may be used in manufacturing devices other than semiconductor devices.

What is claimed is:

1. A method of device manufacturing comprising planarizing a pattern delineated material; said planarizing step comprising the steps of depositing a first layer comprising a first material on the surface of said pattern delineated material; the surface of said first material being substantially planar; and milling said surface with a particle beam at a non-normal angle of incidence and with a momentum whereby said first material and said material underneath said first material are eroded at substantially equal rates.

2. A method as recited in claim 1 in which said particle beam comprises ions.

3. A method as recited in claim 2 comprising the further step of depositing a second layer comprising a second material, said second layer being between said first layer and said pattern delineated material.

4. A method as recited in claim 3 in which said first material is liquid-like.

5. A method as recited in claim 4 in which said first material comprises a resist.

6. A method as recited in claim 3 or 5 in which said patterned delineated material comprises a semiconductor.

7. A method as recited in claim 6 in which said semiconductor comprises silicon.

8. A method as recited in claim 7 in which said second material comprises a glass.

9. A method as recited in claim 8 in which said second material comprises SiO$_2$.

10. A method as recited in claim 9 in which said second material further comprises phosphorus.

11. A method as recited in claim 9 in which the thickness of said material is at least as great as the depth of the recesses in said pattern delineated surface.

12. A method as recited in claim 6 comprising the further step of pattern delineating said planarized surface.

* * * * *